United States Patent
Hsu et al.

(10) Patent No.: US 9,265,146 B2
(45) Date of Patent: Feb. 16, 2016

(54) METHOD FOR MANUFACTURING A MULTI-LAYER CIRCUIT BOARD

(71) Applicant: Zhen Ding Technology Co., Ltd., Tayuan, Taoyuan (TW)

(72) Inventors: Che-Wei Hsu, Taoyuan (TW); Shih-Ping Hsu, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 182 days.

(21) Appl. No.: 13/925,136

(22) Filed: Jun. 24, 2013

(65) Prior Publication Data

US 2014/0000950 A1 Jan. 2, 2014

(30) Foreign Application Priority Data

Jun. 27, 2012 (CN) .......................... 2012 1 0215060

(51) Int. Cl.
  H05K 1/11 (2006.01)
  H05K 3/46 (2006.01)
  H05K 3/42 (2006.01)

(52) U.S. Cl.
  CPC ................. *H05K 1/11* (2013.01); *H05K 3/429* (2013.01); *H05K 3/4652* (2013.01); *Y10T 29/49155* (2015.01)

(58) Field of Classification Search
  CPC ..... H05K 1/11; H05K 3/4602; H05K 3/4611; H05K 3/4614; H05K 3/4652; H05K 3/429; Y10T 29/49155
  See application file for complete search history.

(56) References Cited

U.S. PATENT DOCUMENTS

| | | | | |
|---|---|---|---|---|
| 6,571,467 | B2 * | 6/2003 | Haze et al. | 29/852 |
| 8,242,379 | B2 * | 8/2012 | Ikeda et al. | 174/261 |
| 8,569,880 | B2 * | 10/2013 | Inagaki et al. | 257/700 |
| 2003/0135994 | A1 * | 7/2003 | Shutou et al. | 29/830 |
| 2007/0096328 | A1 * | 5/2007 | Takahashi et al. | 257/774 |
| 2007/0209831 | A1 * | 9/2007 | Sakamoto et al. | 174/262 |
| 2009/0090542 | A1 * | 4/2009 | Inagaki et al. | 174/255 |

FOREIGN PATENT DOCUMENTS

| | | |
|---|---|---|
| JP | H11-214849 A | 8/1999 |
| JP | 2002-26518 A | 1/2002 |
| JP | 2004-289111 A | 10/2004 |
| JP | 2006-165496 A | 6/2006 |
| TW | I267332 B | 11/2006 |
| TW | 200803675 A | 1/2008 |
| TW | 201044930 A | 12/2010 |
| TW | 201132263 A | 9/2011 |

* cited by examiner

*Primary Examiner* — Carl Arbes
(74) *Attorney, Agent, or Firm* — Novak Druce Connolly Bove + Quigg LLP

(57) ABSTRACT

A method for manufacturing a multi-layer circuit board includes steps of: providing three copper clad laminates; forming trace layers in each copper clad laminate by selectively removing portions of copper layer of each copper clad laminate to obtain three first circuit substrates; laminating a dielectric layer on two of the first circuit substrates to obtain two second circuit substrates; forming a metal bump on the trace layer he other one of the three first circuit substrate to obtain a third circuit substrate; stacking and laminating the third circuit substrate between the two second circuit substrate to obtain a multi-layer circuit board.

12 Claims, 19 Drawing Sheets

METHOD FOR MANUFACTURING A MULTI-LAYER CIRCUIT BOARD

BACKGROUND

1. Technical Field

The present disclosure generally relates to circuit board technology, and particularly to a multi-layer circuit board and method for manufacturing the multi-layer circuit board.

2. Description of Related Art

To accommodate the development of miniaturized electronic products with multiple functions, multilayer printed circuit boards are widely used due to their characteristics such as lightness and high-density interconnectability.

Multilayer printed circuit boards are manufactured by using a typical sheet-by-sheet process. First a core substrate is provided, and an inner electrically conductive trace layer is formed on the core substrate. Second, an adhesive layer and a first electrically conductive layer such as a copper foil are sequentially laminated onto the core substrate. Third, a blind hole is formed in the adhesive layer and the first electrically conductive layer. Fourth, a first electrically conductive trace layer is formed by selectively etching the first electrically conductive layer, and a plated metal layer is formed in the blind hole to form a blind via, thus the first electrically conductive trace layer electrically communicates to the inner electrically conductive trace layer by the blind via. Afterwards, another adhesive layer and a second electrically conductive layer are sequentially laminated onto the first electrically conductive trace layer, another electrically conductive trace layer is formed by selectively etching the second electrically conductive layer, and another blind via is formed to electrically communicates the second electrically conductive layer and the first electrically conductive layer. Thus, a multilayer printed circuit board is obtained. However, only one electrically conductive layer can be laminated at one time. Thus, the process for making the multilayer printed circuit board is too long, and a cost for manufacturing the multilayer printed circuit board is too high.

What is needed, therefore, is a multi-layer circuit board and method for manufacturing the multi-layer circuit board to overcome the above-described problems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

A multi-layer circuit board and a method for manufacturing a multi-layer circuit board according to embodiments will be described with reference to the drawings.

A method of manufacturing a multi-layer circuit board according to a first embodiment includes the steps as follows.

Figure 1:
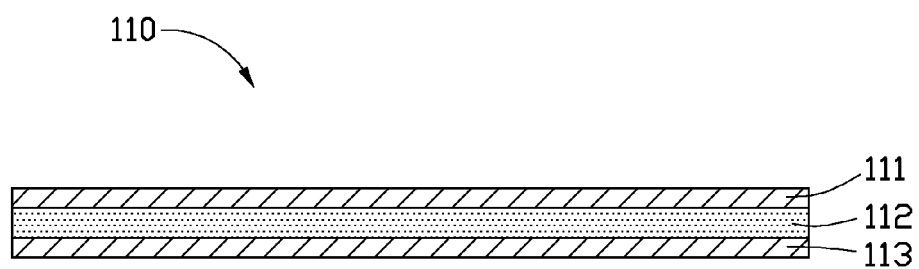
FIG. 1 is a schematic, cross-sectional view of a copper clad laminate according to a first embodiment.

FIG. 1 shows in step 1, three copper clad laminates 110 are provided. Each copper clad laminate 110 includes a first copper layer 111, an insulating layer 112 and a second copper layer 113 stacked in above descried order. The copper clad laminate 110 may be a flexible copper clad laminate or a rigid copper clad laminate.

Figure 2:
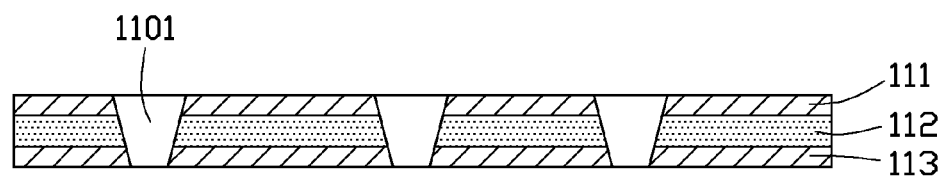
FIG. 2 is similar to FIG. 1, but showing a through hole defined in the copper clad laminate.
Figure 3:
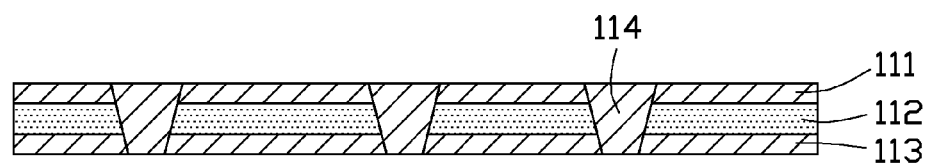
FIG. 3 is similar to FIG. 2, but showing a f plated through hole formed in the copper clad laminate.
Figure 4:
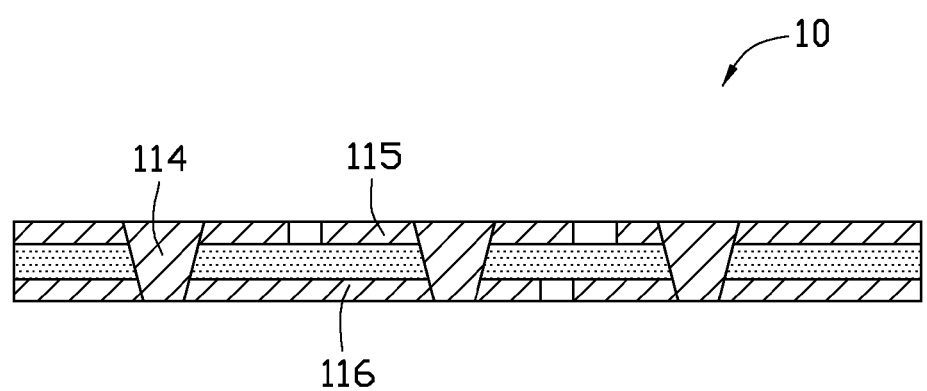
FIG. 4 is similar to FIG. 3, but showing a first trace layer and a second trace layer formed in the copper clad laminate to form a first circuit substrate.

FIGS. 2, 3 and 4 show in step 2, a plated through hole 114 is formed in each copper clad laminate 110. A first trace layer 115 is formed by selectively removing portions of first copper layer 111. A second trace layer 116 is formed by selectively removing portions of second copper layer 113. The first trace layer 115 and the second trace layer 116 electrically communicate via the plated through hole 114, thus, three first circuit substrates 10 are obtained.

In the present embodiment, the plated through hole 114 may be formed by the following steps. First, a through hole 1101 is defined in the copper clad laminate 110. The through hole 1101 runs through the first copper layer 111, the insulating layer 112 and the second copper layer 113. The through hole 1101 may be formed by laser. Second, the through hole 1101 is filled by plated metal to obtain a plated through hole 114.

Figure 5:
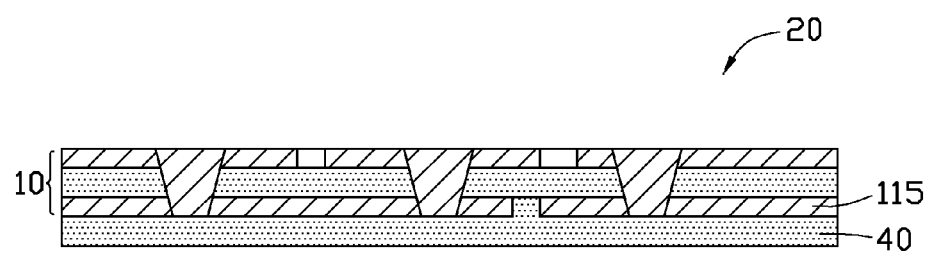
FIG. 5 is similar to FIG. 4, but showing a dielectric layer laminated on the first circuit substrate to form a second circuit substrate.

FIG. 5 shows in step 3, each dielectric layer 40 is laminated on first trace layer 115 of two of the three first circuit substrates 10, thus two second circuit substrate 20 are obtained.

In the present embodiment, the dielectric layer 40 is made of Ajinomoto build-up film (ABF). The dielectric layer 40 may be laminated on the first trace layer 115 by a vacuum laminator. After laminating, the dielectric layer 40 is in B-stage. In other words, the dielectric layer 40 will soften and able to float under high temperature and high pressure, and then will be cured. It can be understood, the dielectric layer 40 also can be made from other dielectric material, such as polyimide (PI).

FIGS. 6, 7, 8 and 9 show step 4, a first metal bump 1151 is formed on the first trace layer 115 and a second metal bump 1161 is formed on the second trace layer 116 of the other one of the three first circuit substrate 10, thus a third circuit substrate 30 is obtained.

In the present embodiment, the first metal bump 1151 and the second metal bump 1161 may be formed by the following steps.

Figure 6:
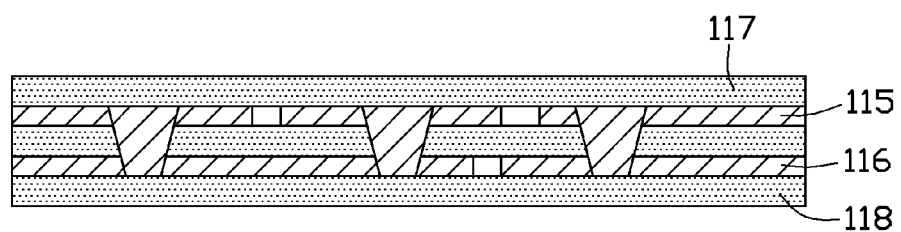
FIG. 6 is similar to FIG. 4, but showing a photo resist layer attached on each surface of the first circuit substrate.

First, as FIG. 6 shows, a first photo resist layer 117 and a second photo resist layer 118 are formed on two opposite surfaces of the first circuit substrate 10. The first photo resist layer 117 and the second trace layer 118 may be made of photo resist. The first photo resist layer 117 and the second photo resist layer 118 may be formed by printing liquid photo resist or laminating a dry film. A thickness of the first photo resist layer 117 or the second photo resist layer 118 may be equal to that of the dielectric layer 40.

Figure 7:
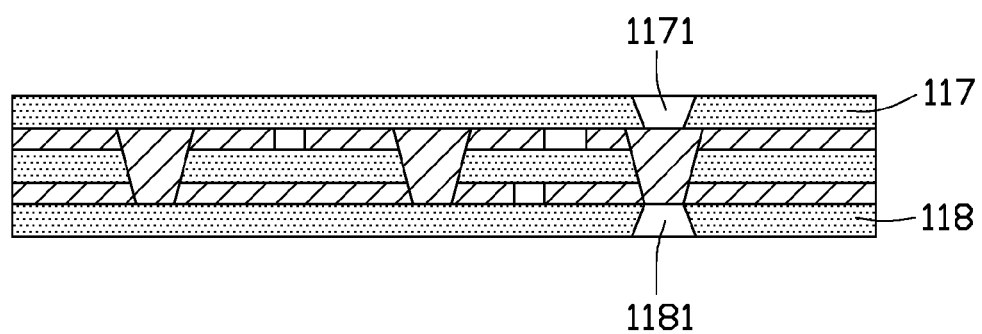
FIG. 7 is similar to FIG. 6, but showing a through hole defined in each photo resist layer.

Second, as FIG. 7 shows, a first hole 1171 is defined in the first photo resist layer 117, and a second hole 1181 is defined in the second photo resist layer 118. The first hole 1171 and the second hole 1181 may be formed by laser. Portion of the first trace layer 115 is exposed form the first hole 1171. Portion of the second trace layer 116 is exposed from the second hole 1181.

Figure 8:
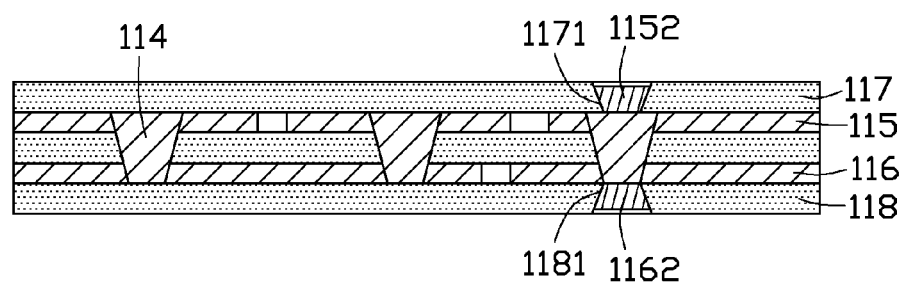
FIG. 8 is similar to FIG. 7, but showing a copper layer formed in the through hole defined in each resist.
Figure 9:
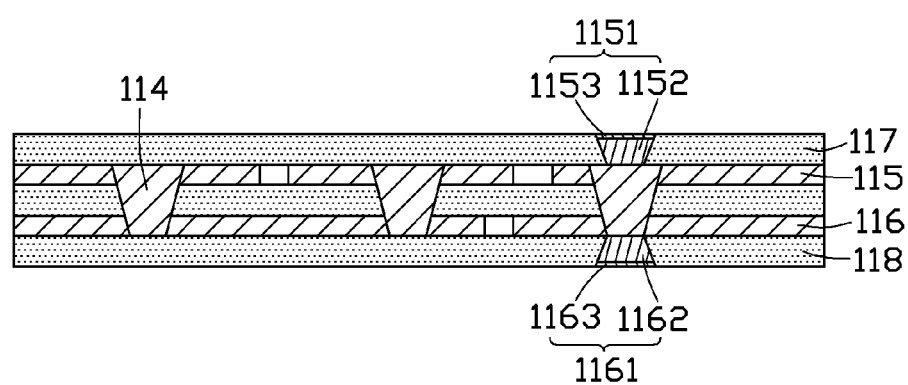
FIG. 9 is similar to FIG. 8, but showing a tin layer formed on the copper layer in the through hole of the photo resist layer.

Third, as FIGS. 8 and 9 show, a first metal bump 1151 is formed in the first hole 1171, and a second metal bump 1161 is formed in the second hole 1181. The first metal bump 1151 is composed of a first copper layer 1152 and a first tin layer 1153. The first copper layer 1152 may be formed by electrical plated copper on the surface of the first trace layer 115 exposed in the first hole 1171. A thickness of the first copper layer 1152 is smaller than that deepness of the first hole 1171. The first tin layer 1153 may be formed by electrical plating tin on the surface of the first copper layer 1152 exposed in the first hole 1171. The second metal bump 1161 is composed of a second copper layer 1162 and a second tin layer 1163. The second copper layer 1162 may be formed by electrical plated copper on the surface of the second trace layer 116 exposed in the second hole 1181. A thickness of the second copper layer 1162 is smaller than that deepness of the second hole 1181. The second tin layer 1163 may be formed by electrical plated tin on the surface of the second copper layer 1162 exposed in the second hole 1181.

Figure 10:
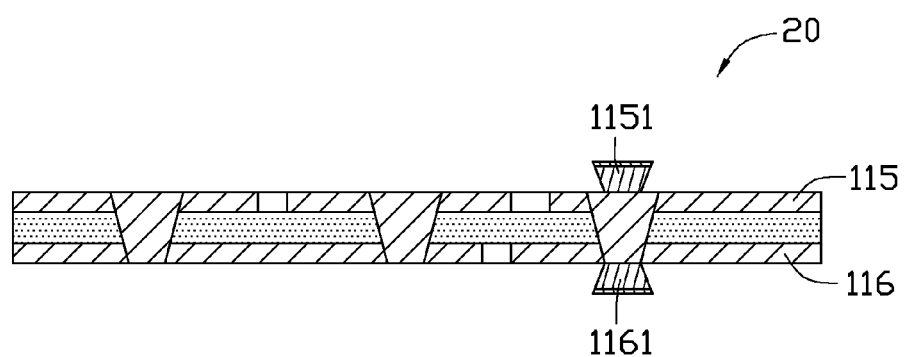
FIG. 10 is similar to FIG. 9, but showing the photo resist layer removed to obtain a third circuit board.

Fourth, as FIG. 10 shows, the first photo resist layer 117 and the second photo resist layer 118 are removed.

Figure 11:
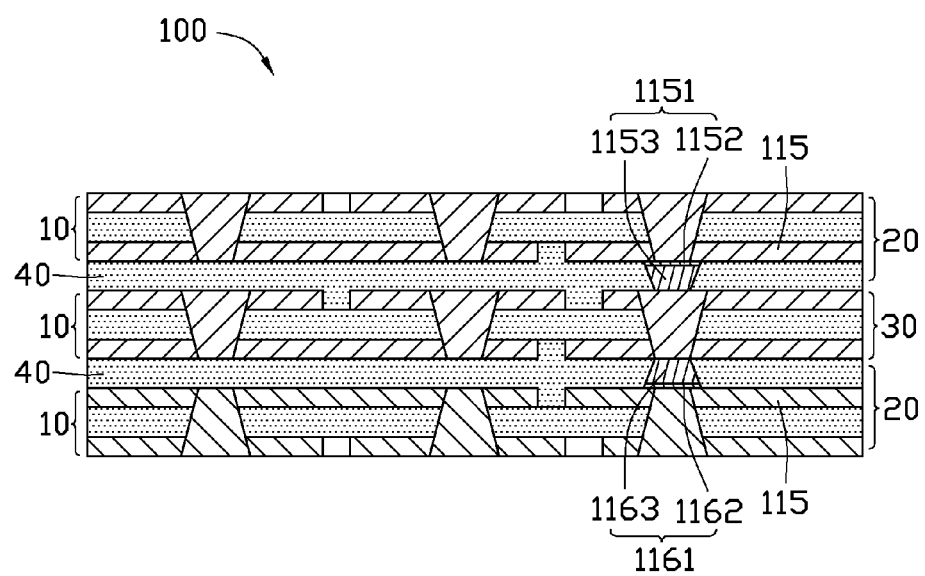
FIG. 11 is similar to FIG. 10, but showing a third circuit board laminated between two second circuit boards to obtain a multi-layer circuit board.

FIG. 11 shows in step 5, the third circuit substrate 30 is stacked and laminated between two second circuit substrates 20, and the dielectric layers 40 of the second circuit substrates 20 is adjacent to the third circuit substrate 30, the first metal bump 1151 and the second metal bump 1161 pass through the dielectric layers 40 adjacent and electrically connect to the first trace layers 115 of the second circuit substrates 20, respectively.

In detail, before laminating, the dielectric layers 40 are in B-stage. When laminating, the dielectric layers 40 become soften and able to float, thereby, the first metal bump 1151 and the second metal bump 1161 can pass through the dielectric layers 40 and connect to the first trace layers 115 of the second circuit substrates 20.

In step 6, the first tin layer 1153 and the second tin layer 1163 are bond with the first trace layers 115 using a reflow soldering process.

In present embodiment, the laminated third circuit board 30 and two second circuit substrates 20 is positioned in a reflow oven to bake. A peak baking temperature is in a range from 210° C. to 230° C. When baking, the first tin layer 1153 and the second tin layer 1163 are melted and bond with the first trace layer 115.

In step 7, the dielectric layers 40 are cured by post baking, and a multi-layer circuit board 100 is obtained as FIG. 11 shows.

In the post baking, the baking temperature is in a range from 100° C. to 15° C. The post baking last time is in a range from 30 minutes to 90 minutes.

Figure 12:
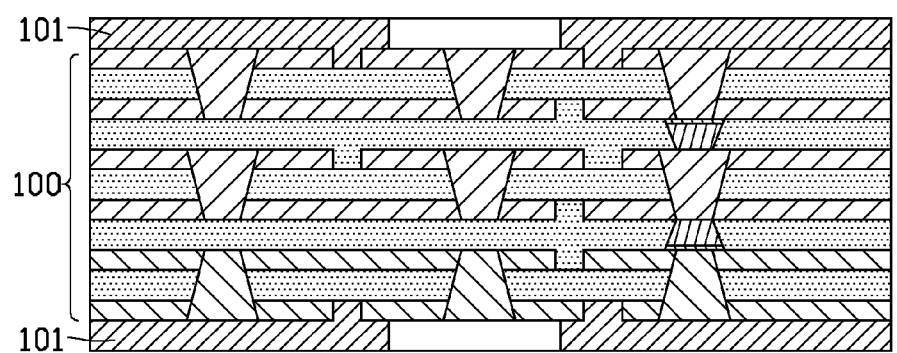
FIG. 12 is similar to FIG. 11, but showing a solder mask formed on the surface of the multi-layer circuit board according to the first embodiment.

As FIG. 12 shows, the method may further includes forming a solder mask 101 on surfaces of the multi-layer circuit board 100 to protect the second trace layer 116.

As FIGS. 11 and 12 show, the multi-layer circuit board 100 includes two second circuit substrates 20 and one third circuit substrate 30. The third circuit substrate 30 is sandwiched between the two second circuit substrates 20.

In other words, the multi-layer circuit board 100 includes three first circuit substrates 10 and two dielectric layers 40. Each dielectric layer 40 is arranged between two neighbor first circuit substrates 10. The metal pump 1151 or 1161 is arranged in each dielectric layer 40 and passes through each dielectric layer 40. Two neighbor first circuit substrates 10 are electrically connected with each other via the metal pump 1151 or 1161 therebetween. The dielectric layer 40 is made of ABF. The first metal bump 1151 is composed of a first copper layer 1152 and a first tin layer 1153. The second metal bump 1161 is composed of a second copper layer 1162 and a second tin layer 1163.

A method of manufacturing a multi-layer circuit board according to a second embodiment includes the steps as follows.

Figure 13:
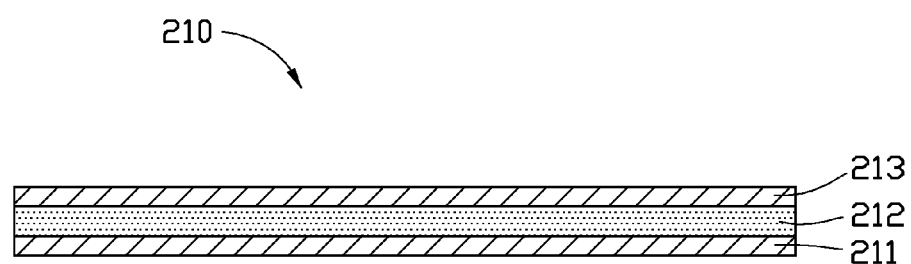
FIG. 13 is a schematic, cross-sectional view of a copper clad laminate according to a second embodiment.
Figure 14:
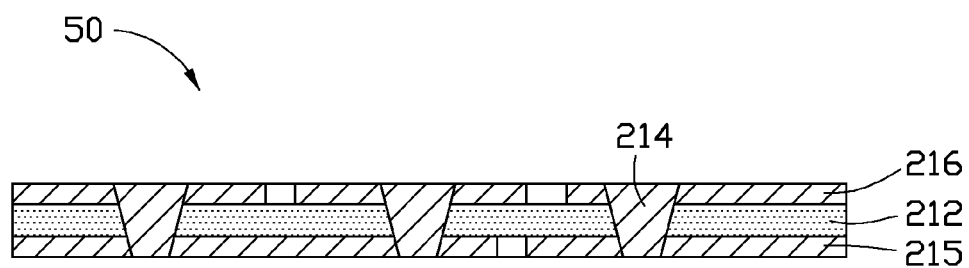
FIG. 14 is similar to FIG. 13, but showing a first trace layer and a second trace layer formed in the copper clad laminate to obtain a first circuit substrate.

FIG. 13 shows in step 1, five copper clad laminates 210 are provided. Each copper clad laminate 210 includes a first copper layer 211, an insulating layer 212 and a second copper layer 213 stacked in above described order. The copper clad laminate 210 may be a flexible copper clad laminate or a rigid copper clad laminate.

Figure 15:
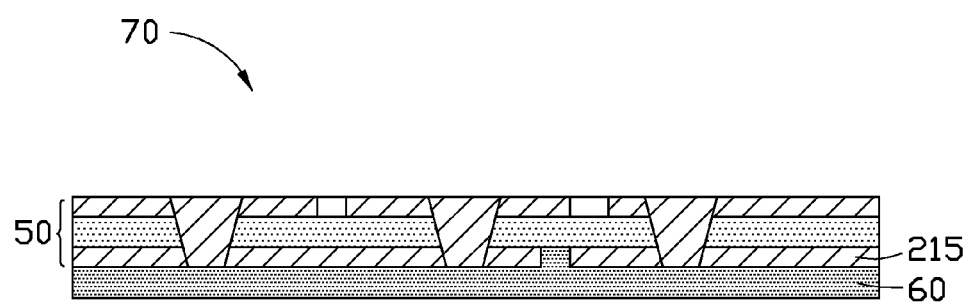
FIG. 15 is similar to FIG. 14, but showing a dielectric layer laminated on a surface of the first circuit substrate to form a second circuit substrate.

FIG. 15 shows in step 2, a plated through hole 214 is formed in each copper clad laminate 210. A first trace layer 215 is formed by selectively removing portions of first copper layer 211. A second trace layer 216 is formed by selectively removing portions of second copper layer 213. The first trace layer 215 and the second trace layer 216 electrically communicate via the plated through hole 214. Thus, five first circuit substrates 50 are obtained.

In the present embodiment, the plated through hole 214 may be formed by the following steps. First, a through hole is defined in the copper clad laminate 210. The through hole passes through the first copper layer 211, the insulating layer 212 and the second copper layer 213. The through hole may be formed by laser. Second, the through hole is filled by plated metal to obtain the plated through hole 214.

Figure 16:
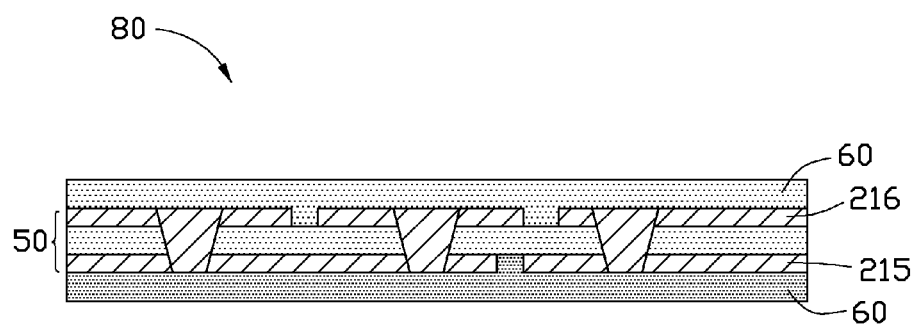
FIG. 16 is similar to FIG. 14, but showing each dielectric layer laminated on each opposite surface of the first circuit substrate to form a fourth circuit substrate.

FIGS. 15 and 16 show step 3, in which three first circuit boards are chosen from the five first circuit substrates 50. Two dielectric layers 60 are respectively laminated on the first trace layers 215 of two chosen first circuit substrates 50, thus two second circuit substrate 70 are obtained. Another two dielectric layers 60 are respectively laminated on the first trace layer 215 and the second trace layer 216 of the other chosen first circuit substrate 50 thus a fourth circuit substrate 80 is obtained.

In the present embodiment, the dielectric layer 60 is made of ABF. The dielectric layer 60 may be laminated on the first trace layer 215 by a vacuum laminator. After laminating, the dielectric layer 60 is in B-stage. In other words, the dielectric layer 60 will soften and able to float under high temperature and high pressure, and then will be cured.

Figure 17:
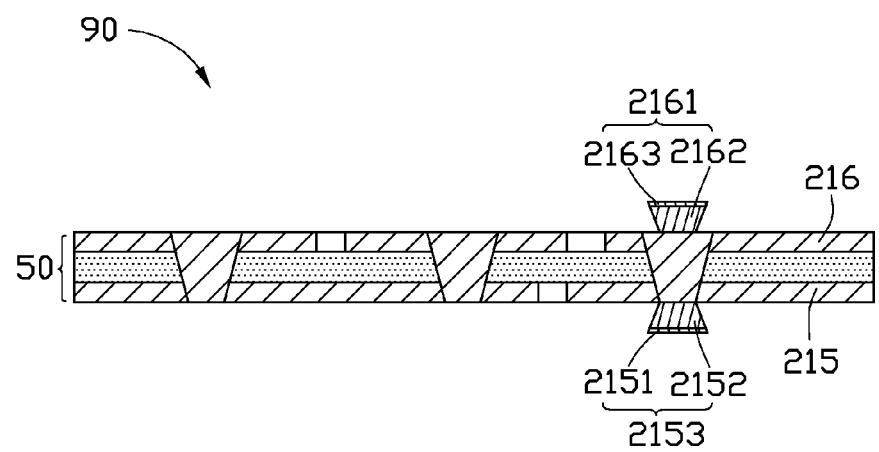
FIG. 17 is similar to FIG. 14, but showing a metal bump formed on the first circuit substrate to obtain a third circuit substrate.

FIG. 17 shows in step 4, each first metal bump 2151 is respectively formed on the first trace layer 215 of the remaining two of the five first circuit boards 50, each second metal bump 2161 is respectively formed on the second trace layer 216 of the remaining two of the five first circuit boards 50. Accordingly, two third circuit substrates 90 are obtained.

In the present embodiment, the first metal bump 2151 and the second metal bump 2161 may be formed by the same method as the first metal bump 1151 and the second metal bump 1161 in the first embodiment.

The first metal bump 2151 is composed of a first copper layer 2152 and a first tin layer 2153. The second metal bump 2161 is composed of a second copper layer 2162 and a second tin layer 2163.

Figure 18:
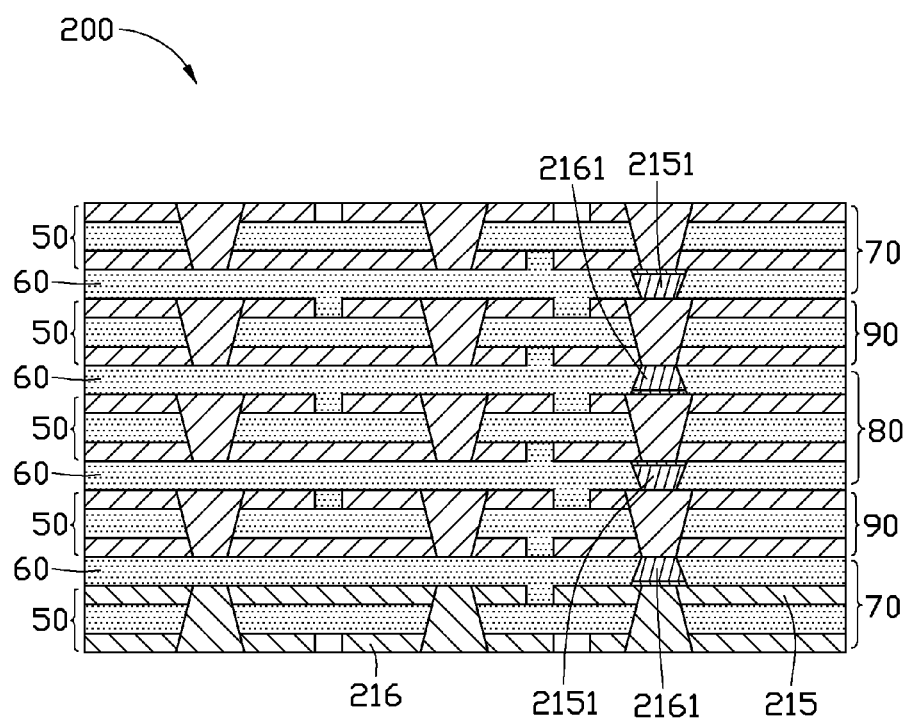
FIG. 18 is similar to FIG. 17, but showing two second circuit substrates, two third circuit substrates and one fourth circuit substrate laminated to obtained a multi-layer circuit board according to the second embodiment.

FIG. 18 shows in step 5, the two third circuit board 30 are arranged between two second circuit substrates 20, the fourth circuit board 80 is arranged between the two second circuit substrates 70, and the dielectric layer 60 of each second circuit substrates 70 is adjacent to neighboring the third circuit substrate 90. Then, the two second circuit substrates 70, the two third circuit substrates 90 and the fourth circuit substrate 80 are laminated. The first metal bump 2151 and the second metal bump 2161 respectively pass through the dielectric layers 60 adjacent and electrically connect to the first trace layers 215 of the second circuit substrates 20, the first trace layer 215 or second trace layer 216 of the fourth circuit substrate 80.

In detail, before laminating, the dielectric layers 60 are in B-stage. When laminating, the dielectric layers 60 become soften and able to float, thus, the first metal bump 2151 and the second metal bump 2161 can pass through the dielectric layers 20 and connect to the first trace layers 215 of the second circuit substrates 20, the first trace layer 215 or second trace layer 216 of the fourth circuit substrate 80.

In step 6, the first tin layer 2153 and the second tin layer 2163 are respectively bond with the first trace layers 215 of the second circuit substrates 20, the first trace layer 215 and the second trace layer 216 of the fourth circuit substrate 80 using a reflow soldering process.

In present embodiment, the laminated the two second circuit substrates 70, the two third circuit substrates 90 and the fourth circuit substrate 80 are positioned in a reflow oven to bake. A peak baking temperature is in a range from 210° C. to 230° C. When baking, the first tin layer 2153 and the second tin layer 2163 are melted and bond with the first trace layers 215 of the second circuit substrates 20, the first trace layer 215 and the second trace layer 216 of the fourth circuit substrate 80.

In step 7, the dielectric layers 60 are cured by post baking, and a multi-layer circuit board 200 is obtained.

In the post baking, the baking temperature is in a range from 100° C. to 15° C. The post baking last time is in a range from 30 minutes to 90 minutes.

Figure 19:
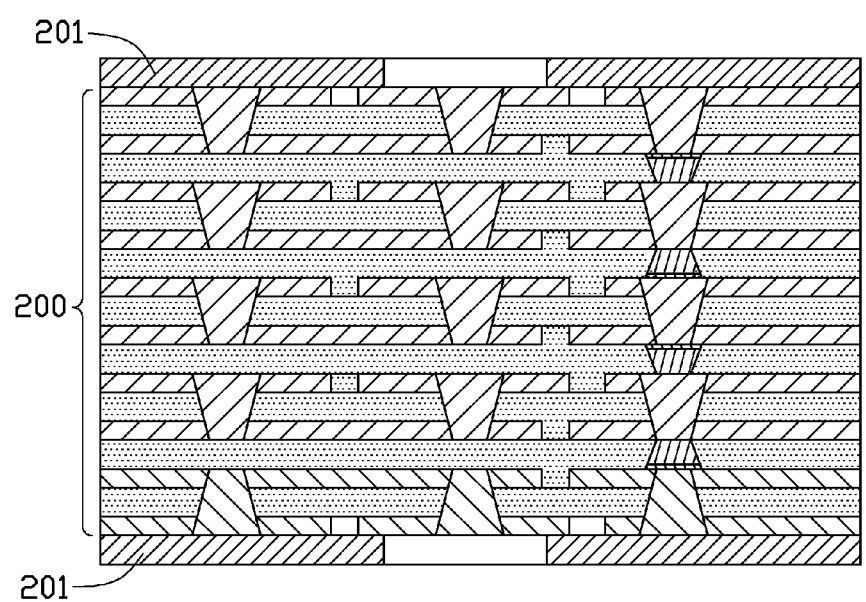
FIG. 19 is similar to FIG. 18, but showing a solder mask formed on the surface of the multi-layer circuit board.

As FIG. 19 shows, the method may further includes forming a solder mask 201 on surfaces of the multi-layer circuit board 200.

It can be understood, the present method for manufacturing multi-layer circuit board also can applying for manufacturing more layers circuit board. If N+1 third circuit substrates 90, N fourth circuit substrates 80 and two second circuit substrates 80 are provided, wherein N is a natural number and not less than 1, the N+1 third circuit substrates 90 and the N fourth circuit substrates 80 are arranged between the two second circuit substrates 70, only one fourth circuit substrate 80 is arranged between two neighbor third circuit substrates 90, and only one third circuit substrate 90 is arranged between two neighbor two fourth circuit substrates 80. Then, the N+1 third circuit substrates 90, N fourth circuit substrates 80 and two second circuit substrates 80 are laminated and processed as in step 6 and 7, thus a 4N+6 layers circuit board will be obtained.

In other words, the multi-layer circuit board 200 includes 2N+3 first circuit substrates 50, 2N+2 dielectric layers 60, and a number of first and second metal bumps 2151, 2161. Each dielectric layer 60 is laminated between two first circuit substrates 50. At least one first mental bump 2151 or at least one second mental bump 2161 is arranged between two first circuit substrates 50. Each first metal bump 2151 or second metal bump 2161 passes through one dielectric layer 60. Each two opposite ends of the first metal bump 2151 or second metal bump 2161 connects with first trace layer 215 and second trace layer 216 of the first circuit substrate 50 to electrically communicating the two neighbor first circuit substrates 20.

In the present embodiment, in the process of manufacturing the multi-layer circuit board, only one time laminating process is needed. Accordingly, the time of manufacturing the multi-layer circuit board can be reduced. In addition, the circuit substrates are formed respectively, the rate of finished product of multi-layer circuit board is higher.

While certain embodiments have been described and exemplified above, various other embodiments will be apparent from the foregoing disclosure to those skilled in the art. The disclosure is not limited to the particular embodiments described and exemplified but is capable of considerable variation and modification without departure from the scope and spirit of the appended claims.

What is claimed is:

1. A method for manufacturing a multi-layer circuit board, comprising:

providing three copper dad laminates, each copper clad laminate including a first copper layer, a second copper layer and an insulating layer arranged between the first copper layer and the second copper layer;

selectively removing portions of the first copper layer of each copper clad laminate to obtain a first trace layer, and selectively removing portions of second copper layer of each copper clad laminate to obtain a second trace layer, thereby obtaining three first circuit substrates;

laminating a dielectric layer on each first trace layer of two of the first circuit substrates, thereby obtaining two second circuit substrates;

forming a first metal bump on the first trace layer and a second metal bump on the second trace layer of the remaining one of the three first circuit substrate, thereby obtaining a third circuit substrate;

stacking and laminating the third circuit substrate between the two second circuit substrates, the dielectric layers of the second circuit substrates adjacent to the third circuit substrate, the first metal bump and the second metal bump passing through the dielectric layers and electrically connected to the first trace layers of the second circuit substrates.

2. The method of claim 1, wherein the dielectric layers are in B-stage after laminating on each first trace layer of two of the first circuit substrates.

3. The method of claim 1, wherein the first metal bump comprises a first copper layer and a first tin layer, the second metal bump comprises a second copper layer and a second tin layer, a method for forming the first metal bump and the second metal bump comprising:
   forming a first photo resist layer and a second photo resist layer on two opposite surfaces of the first circuit substrate;
   defining a first hole in the first photo resist layer, and defining a second hole in the second photo resist layer, thereby, a portion of the first trace layer being exposed in the first hole, a portion of the second trace layer being exposed in the second hole;
   forming a first copper layer in the first hole and forming a second copper layer in the second hole;
   forming a first tin layer on the first copper layer and forming a second tin layer on the second copper layer, and
   removing the first photo resist layer and the second photo resist layer.

4. The method of claim 1, further comprising melting the first tin layer and the second tin layer to bond the first tin liner and the second tin layer with the first trace layers using a reflow soldering process after stacking and laminating the third circuit substrate between the two second circuit substrates.

5. The method of claim 4, further comprising curing the dielectric layer after the first tin layer and the second tin layer are melted and bonded with the first trace layers.

6. The method of claim 1, wherein the dielectric layer is Ajinomoto build-up film.

7. A method for manufacturing a multi-layer circuit board, comprising:
   providing 2N+3 copper clad laminates, each copper clad laminate including a first copper layer, a second copper layer and an insulating layer arranged between the first copper layer and the second copper layer, wherein N is a natural number and not less than 1;
   forming a first trace layer by selectively removing portions of first copper layer of each copper clad laminate, and forming a second trace layer by selectively removing portions of second copper layer of each copper clad laminate, thereby obtaining 2N+3 first circuit substrates;
   laminating a dielectric layer on each first trace layer of two first circuit substrates, thereby obtaining two second circuit substrates;
   forming a first metal bump on the first trace layer and a second metal bump on the second trace layer of each of the 2N+1 first circuit substrates, thereby obtaining 2N+1 third circuit substrates;
   laminating a dielectric layer on each first trace layer and each second trace layer of the remaining N first circuit substrates, thereby obtaining N fourth circuit substrates;
   stacking and laminating N+1 third circuit substrates and N fourth circuit substrates between the two second circuit substrates, only one of the fourth circuit substrates being arranged between two neighbor third circuit substrates, only one of the third circuit substrates arranged between two neighbor fourth circuit substrates, the dielectric layer of each of the second circuit substrates adjacent to a third circuit substrate, each first metal bump passing through adjacent dielectric layer and electrically connected with the first trace layer of the second or fourth circuit substrate, each second metal bump passing through adjacent dielectric layer and electrically connected with the first trace layer of the second or fourth circuit substrate.

8. The method of claim 7, wherein the dielectric, layers are in B-stage when laminating on each first trace layer of two of the first circuit substrates.

9. The method of claim 7, wherein the first metal bump comprises a first copper layer and a first tin layer, the second metal bump comprises a second copper layer and a second tin layer, a method for forming the first metal bump and the second metal bump comprising:
   forming a first photo resist layer and a second photo resist layer on two opposite surfaces of the first circuit substrate;
   defining a first hole in the first photo resist layer, and defining a second hole in the second photo resist layer, thereby, a portion of the first trace layer being exposed in the first hole, a portion of the second trace layer being exposed in the second hole;
   forming a first copper layer in the first hole and forming a second copper layer in the second hole using a plating process;
   forming a first tin layer on the first copper layer and forming a second tin layer on the second copper layer using a plating process; and
   removing the first photo resist layer and the second photo resist layer.

10. The method of claim 7, further comprising melting the first tin layer and the second tin layer to bond the first tin layer and the second tin layer with the first trace layers using a reflow soldering process after stacking and laminating the third circuit substrate between the two second circuit substrates.

11. The method of claim 10, farther comprising curing the dielectric layer after the first tin layer and the second tin layer are melted and bonded with the first trace layers.

12. The method of claim 7, wherein the dielectric layer is composed of an Ajinomoto build-up film.

* * * * *